United States Patent [19]
Kooijman et al.

[11] Patent Number: 5,421,506
[45] Date of Patent: Jun. 6, 1995

[54] METHOD OF POSITIONING AN OBJECT ON A CARRIER

[75] Inventors: Cornelis S. Kooijman; Nicolaas J. A. Van Veen; Antonius C. M. Gieles; Wessel J. Wesseling, all of Eindhoven, Netherlands

[73] Assignee: U.S. Philips Corporation, New York, N.Y.

[21] Appl. No.: 46,826

[22] Filed: Apr. 13, 1993

[30] Foreign Application Priority Data

May 15, 1992 [EP] European Pat. Off. ........... 92201387

[51] Int. Cl.$^6$ ..................... B23K 37/04; B23K 26/02
[52] U.S. Cl. ................. 228/103; 228/180.21; 228/9
[58] Field of Search ............. 228/103, 9, 10, 180.21; 219/121.64

[56] References Cited

U.S. PATENT DOCUMENTS 3,986,391 10/1976 Vahaviolos ............. 219/121.64
4,633,057 12/1986 Wilson et al. ............ 228/103
4,683,654 8/1987 Scholten et al. .......... 29/832

FOREIGN PATENT DOCUMENTS 0402832 12/1990 European Pat. Off. .
62-114786 5/1987 Japan ....................... 228/103
1245420 7/1986 U.S.S.R. ................... 228/103

OTHER PUBLICATIONS

*Metals Handbook*, 9th Ed., vol. 6, ASM, Metals Park, Ohio (Aug. 1983) pp. 846, 847, 849–851, 855.

Primary Examiner—P. Austin Bradley
Assistant Examiner—Jeffrey T. Knapp
Attorney, Agent, or Firm—Ernestine C. Bartlett

[57] ABSTRACT

Method of positioning an object on a carrier, device suitable for carrying out this method, and suction tube suitable for use in the device.

The method is for laser soldering of an electronic component (7) on a pc-board (1). The component is positioned on a contact face (3) of the pc-board (1) by a device comprising a vibration transducer (53, 69, 85) which is brought into mechanical hard contact with the component (7) while the component is held against the pc-board. Subsequently, a laser (205, 207) heats solder present on the contact face and vibrations generated by the laser in the solder are passed on to the vibration transducer while the mechanical hard contact is being maintained. The vibration transducer then checks for the presence of mechanical contact between the object and the carrier and/or the melting of the solder from a comparatively strong decrease in the vibration amplitude during melting of the solder.

6 Claims, 9 Drawing Sheets

METHOD OF POSITIONING AN OBJECT ON A CARRIER

FIELD OF THE INVENTION

The invention relates to a method of positioning an object on a carrier whereby an object is picked up by a suction tube by means of underpressure and is subsequently placed on a contact face of a carrier by a device comprising the suction tube and a vibration transducer.

The invention also relates to a device suitable for carrying out the method according to the invention. The invention further relates to a suction tube suitable for use in the device according to the invention.

BACKGROUND OF THE INVENTION

In a method and device known from the document U.S. Pat. No. 4,683,654, an object is picked up by means of an underpressure generated in the suction tube. Then the object suspended from the suction tube owing to the underpressure is transported to a placement position above a mounting panel, after which the object is placed on the mounting panel. Such a method and device are used inter alia for placing electronic and/or electric components on a mounting panel which is provided with a printed wiring. The presence or absence of an object at the suction tube is monitored by means of the vibration transducer. If no object is present at the suction tube, a turbulent air flow is generated as a result of the underpressure provided in the suction tube. This air flow can be detected in a chamber connected to the suction tube by means of the vibration transducer which is constructed as a microphone.

In the known method, the vibration transducer is only suitable for presence detection of an object at the suction tube as a result of the comparatively great distance between the object and the vibration transducer, owing to which an effective detection of vibrations is possible only in the air flow.

SUMMARY OF THE INVENTION

The invention has for its object to provide a method by which several data can be ascertained by means of the vibration transducer. The method according to the invention is for this purpose characterized in that the vibration transducer is brought into mechanical hard contact with the object while the object is being held against the carder, after which solder present on the contact face is heated by means of a laser and vibrations generated by the laser in the solder are passed on to the vibration transducer while the mechanical hard contact is maintained, by means of which transducer either the presence of mechanical contact between the object and the carrier is checked, or the melting of the solder is detected from a comparatively strong decrease in the vibration amplitude during melting of the solder, or the presence of mechanical contact and the melting of the solder are registered.

In the method according to the invention, the vibration transducer is used for determining data which are important for effecting a good soldered connection between the object and the carrier.

The term "mechanical hard contact" is to be understood to mean here such a physical contact between the vibration transducer and the object that vibrations in the object can be detected. The contact between the vibration transducer and the object may be direct, i.e. the vibration transducer and the object lie against one another, or indirect, in the sense that an element made of a solid substance is present between the vibration transducer and the object and is capable of transmitting vibrations present in the object to the vibration transducer.

During laser soldering of an object to a carrier, the object is held in the correct position by means of the suction tube and pressed against the carrier. As a result, the object cannot slip off the globular solder already provided on the carrier during or before laser soldering. Heat is introduced into the solder locally by a laser, which causes thermal stresses in the solder. Owing to these thermal stresses, which vary in intensity, the solder will be deformed, whereby ultrasonic vibrations arise. This effect is called "acoustic emission". The ultrasonic vibrations can be detected by the vibration transducer. When the solder melts, the amplitude of the ultrasonic signal decreases strongly, so that the moment the solder melts can be determined.

It is noted that the European Patent Application EP-A1-0402832 discloses a method by which the moment of melting of the solder is derived from the ultrasonic vibrations detected by means of an ultrasonic sensor. The ultrasonic sensor is connected to the workpiece and the signal detected by the ultrasonic sensor is accordingly dependent on the distance between the ultrasonic sensor and the location on the workpiece heated by the laser.

The method according to the invention renders it possible to determine more accurately the time the solder melts because the vibration transducer is brought into mechanical hard contact with the object and is always close to the solder heated by the laser. Since the distance between the location where the vibrations are generated and the vibration transducer is small, a good transfer of the ultrasonic vibrations is obtained.

When electronic components having connection legs are laser-soldered on a mounting panel, a loose connection leg can also be detected by means of the ultrasonic detection. When a connection leg fails to make contact with the solder on the mounting panel, vibrations caused by the laser beam in the solder are not or hardly transmitted to the component, and the vibration transducer will detect no signal or only a weak ultrasonic signal.

It is possible with the method according to the invention to do the following, as desired: either to check only the presence of mechanical contact between object and carrier, or to detect the moment of melting, or to detect both the presence of contact and the moment of melting.

An embodiment of the method according to the invention is characterized in that the vibration transducer is brought into mechanical hard contact with the object during picking-up of the object, and in that during placement of the object on the carrier the descent of the object onto the carrier is detected by means of the vibration transducer.

The object experiences a comparatively great deceleration at the moment of landing, which decelevation is detected by the vibration transducer. The force with which an electronic component is pressed home onto a mounting panel must not be too great in order to prevent damage to the component or the connection legs of the component. Measuring of the moment of landing renders it possible to move the suction tube towards the mounting panel at a comparatively high speed and, from the moment the vibration transducer detects the descent of the object or the component onto the mounting panel, to stop the movement of the suction tube towards the mounting panel, so that the force with which the object or the component is pressed onto the mounting panel is limited. In this manner, a component can be placed on the mounting panel quickly and with a small force.

The invention also has for its object to provide a device for carrying out the method according to the invention by which the disadvantage of the known device is avoided.

The device is for this purpose characterized in that the vibration transducer can be brought into mechanical contact with the object to be positioned. Vibrations in the object can be accurately detected owing to the mechanical contact with the object. The mechanical contact between the vibration transducer and the object may be effected while the object is being picked up by the suction tube, or during or after placement of the object on the carrier.

An embodiment of the device according to the invention is characterized in that the suction tube comprises the vibration transducer.

The mechanical contact between the vibration transducer and the object is obtained while the object is being picked up by the suction tube. In this embodiment, the vibration transducer can be used at the same time for detecting the moment the object descends onto the carrier. The absence of an object at the suction tube can also be detected through detection by the vibration transducer of the air flow occurring in the suction tube.

Another embodiment of the device, in which the suction tube comprises the vibration transducer, is characterized in that the suction tube comprises at least two tube elements which are in mechanical hard contact with one another via the vibration transducer, while a channel is present between the tube elements, extending through the vibration transducer. This has the advantage that the vibration transducer can be mounted comparatively close to that side of the suction tube where the object is picked up, whereas the connection to the underpressure is situated at a greater distance from said side.

A further embodiment of the device, in which the suction tube comprises the vibration transducer, is characterized in that the vibration transducer is annular in shape, while a central opening present in the annular vibration transducer forms part of the channel. Such a vibration transducer can be provided in a simple manner around a circular-cylindrical suction tube or between two tube elements.

A further embodiment of the device according to the invention is characterized in that the vibration transducer is fastened to a pin which is movable in the suction tube.

This embodiment is suitable for use with laser soldering, the pin being brought into contact with the object after the object has been deposited and before laser soldering. The vibration transducer in this embodiment is used for the detection of contact between the object and a contact face provided with solder on, for example, a mounting panel, and for the detection of the melting point of the solder. This embodiment is suitable inter alia in combination with a suction tube made from a material which attenuates or damps vibrations comparatively strongly.

Another embodiment of the device according to the invention is characterized in that the vibration transducer is fastened to a holder which is movable along an axis in a direction parallel to the direction of movement of the suction tube.

This embodiment is suitable for the same applications as the embodiment comprising the pin described above.

A further embodiment of the device according to the invention is characterized in that the vibration transducer comprises a piezoelectric sensor or a magnetostrictive sensor.

Such sensors are inexpensive, have a comparatively high sensitivity to vibrations of widely differing frequencies, and can be connected to the suction tube, the pin, or the holder in a simple manner. A piezoelectric sensor converts mechanical vibrations into an electric signal. A magnetostrictive sensor is one whose magnetic properties are changed by mechanical vibrations.

Another embodiment of the device according to the invention is characterized in that the device is provided with a laser and a laser beam deflection unit which is coupled to a holder in which the suction tube is movable. Such a device is compact and suitable for positioning and soldering of components on various locations on a carrier, the holder with the suction tube and the laser beam deflection unit being displaced to the various locations above the carrier.

BRIEF DESCRIPTION OF THE DRAWINGS

The invention is explained in more detail with reference to the drawing in which.

DETAILED DESCRIPTION OF THE PREFERRED EMBODIMENTS

Figure 1:
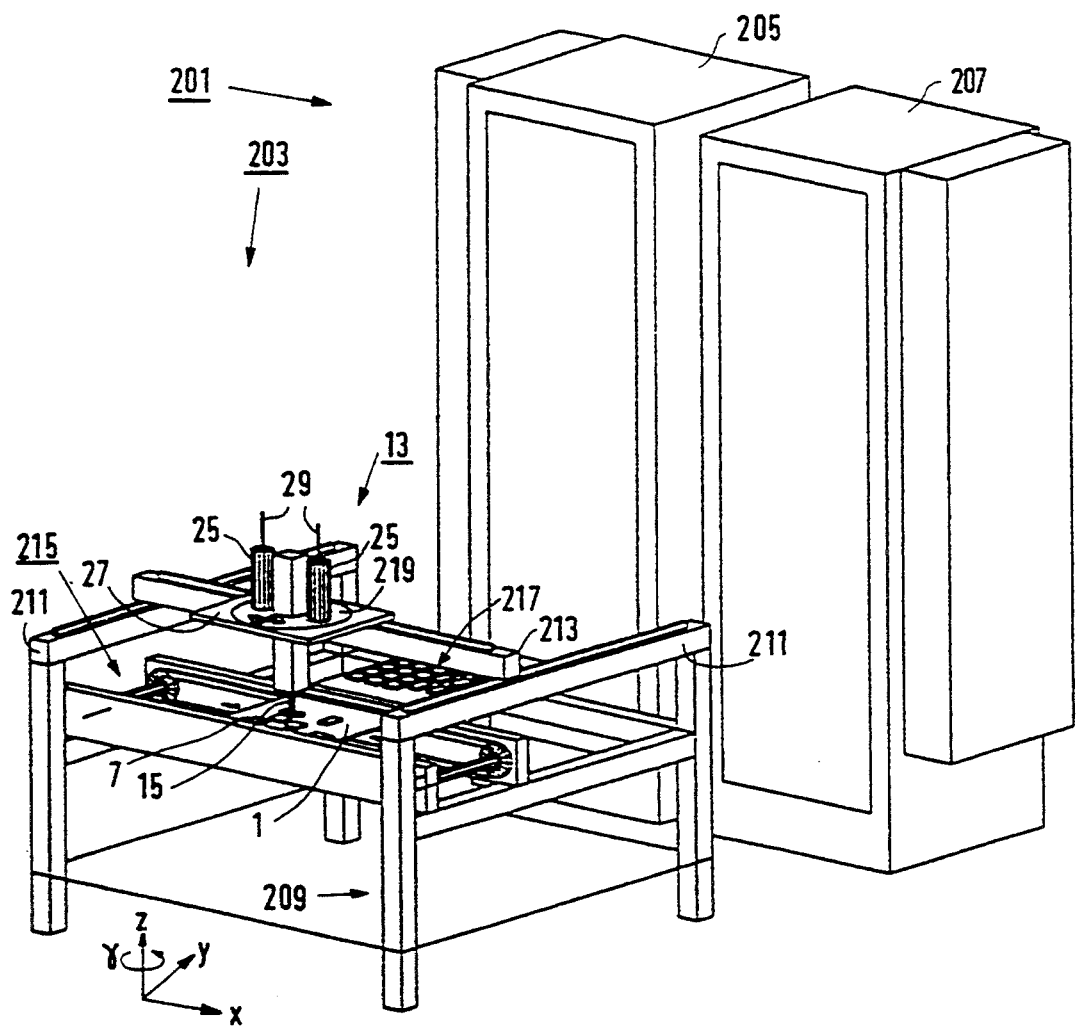
FIG. 1 shows a diagrammatic picture of a device according to the invention, FIG. 2 diagrammatically shows the principle of laser soldering, FIGS. 3a, 3b and 3c each show diagrammatically a position of a placement head with two deflection and focusing devices, FIG. 4 diagrammatically shows a placement head with deflection mirrors, FIG. 5 diagrammatically shows a deflection and focusing device.

Corresponding parts in the various Figures are given the same reference numerals.

FIG. 1 shows a laser soldering device 201 according to the invention which is suitable for carrying out the method according to the invention. The device 201 is provided with a component placement machine 203 and two laser systems 205, 207. The component placement machine 203 is provided with a frame 209 on which two guides 211 are mounted. A slide 213 is displaceable in the y-direction over the guides 211. A placement head 13 is fastened on the slide 213 by means of a carrier plate 27, and is displaceable together with the carder plate 27 in x-direction over the slide 213. The component placement machine 203 is further provided with a feed and delivery device 215 for pc-boards 1 and a feed device 217 for objects such as electronic components 7. After a pc-board 1 has been brought into the machine 203 by means of the feed device 2 15, components 7 are taken from the feed device 217 and put on the pc-board 1 by a suction tube 15 of the placement head 13, this tube being displaceable in the z-direction. The placement head 13 is rotatable in a γ-direction by means of a disc 219 which is rotatable in the carrier plate 27, so that components can be placed on the pc-board 1 in the desired manner. The component placement machine 203 as described hitherto is commercially available. The machine 203, however, has been expanded and provided with two laser heads 25 which are fastened on the disc 219 on either side of the suction tube 15. Each laser head 25 is connected to a laser system 205 or 207 via a fiber 29. The component 7 is soldered onto the pc-board 1 by means of laser light generated in the laser systems 205, 207. The exact operation of the device 201 will be explained in more detail below.

Figure 2:
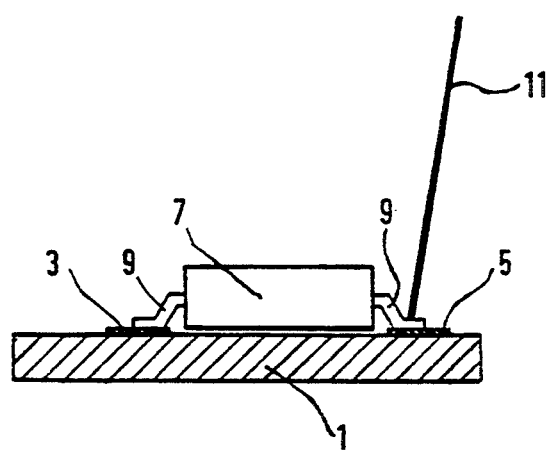

FIG. 2 diagrammatically shows the principle of laser soldering. Laser soldering is a reflow soldering technique whereby connections between components are effected in that solder provided in advance on one of the components is melted without the addition of extra material during soldering. Melting of the solder takes place by means of laser light in the case of laser soldering. FIG. 2 shows a pc-board 1 (carrier) having contact faces 3 on which solder 5 is provided. An electronic component 7 is placed with its connection legs 9 on the solder 5. The solder 5 is re-melted by means of a laser beam 11 via the connection legs. After the solder 5 has hardened, an electrical and mechanical connection between the component 7 and the contact face 3 of a conductor pattern on the pc-board 1 has been realised.

Figures 3A, 3B, 3C:
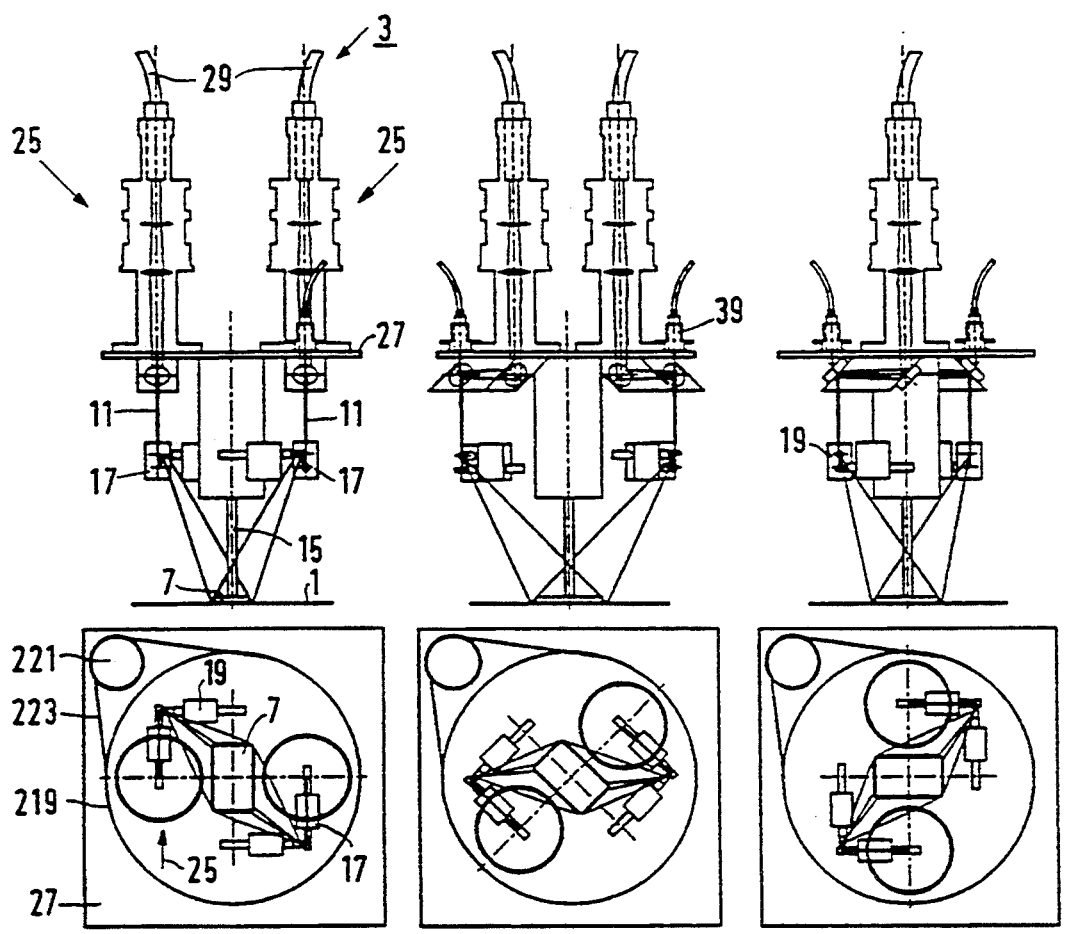
Figure 4:
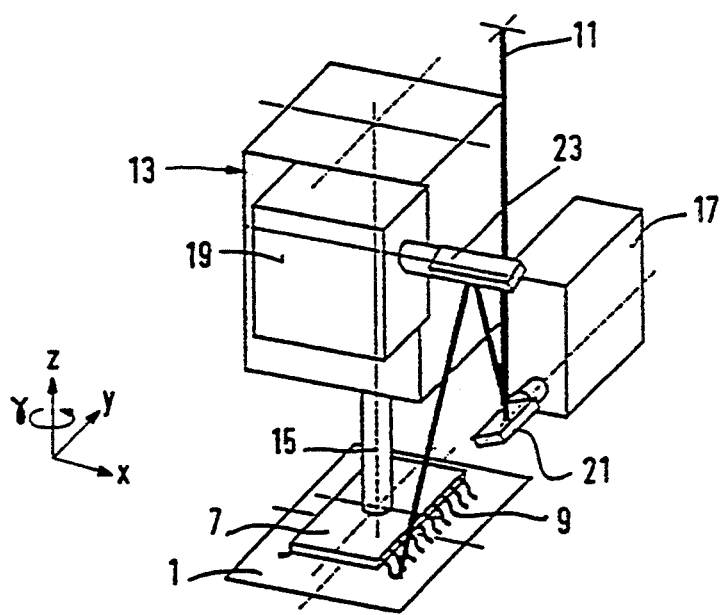

FIGS. 3a, 3b and 4 show pan of the device depicted in FIG. 1, in which a placement head 13 with a suction tube 15 and two laser heads 25 is shown. For the sake of simplicity, FIG. 4 shows only one laser beam 11 coming from a laser head 25. The placement head 13 is provided with two pairs of galvanometers 17, 19 which are provided with mirrors 21 and 23, respectively (see FIG. 4) for deflecting the laser beam 11. The laser beam 11 is deflected in the x-direction through rotation of the mirror 21 by the galvanometer 17, whereas it is deflected in the y-direction through rotation of the mirror 23 by the galvanometer 19. Connections can be made simultaneously on both sides of the component 7 by the two laser beams 11 of the two laser heads 25.

The disc 219 on which the placement head 13 is fastened is rotatable in the carrier plate 27 by means of a rope 223 driven by a motor 221. FIGS. 3a, 3b and 3c show three different positions of the placement head 13 relative to the carrier plate 27.

Figure 5:
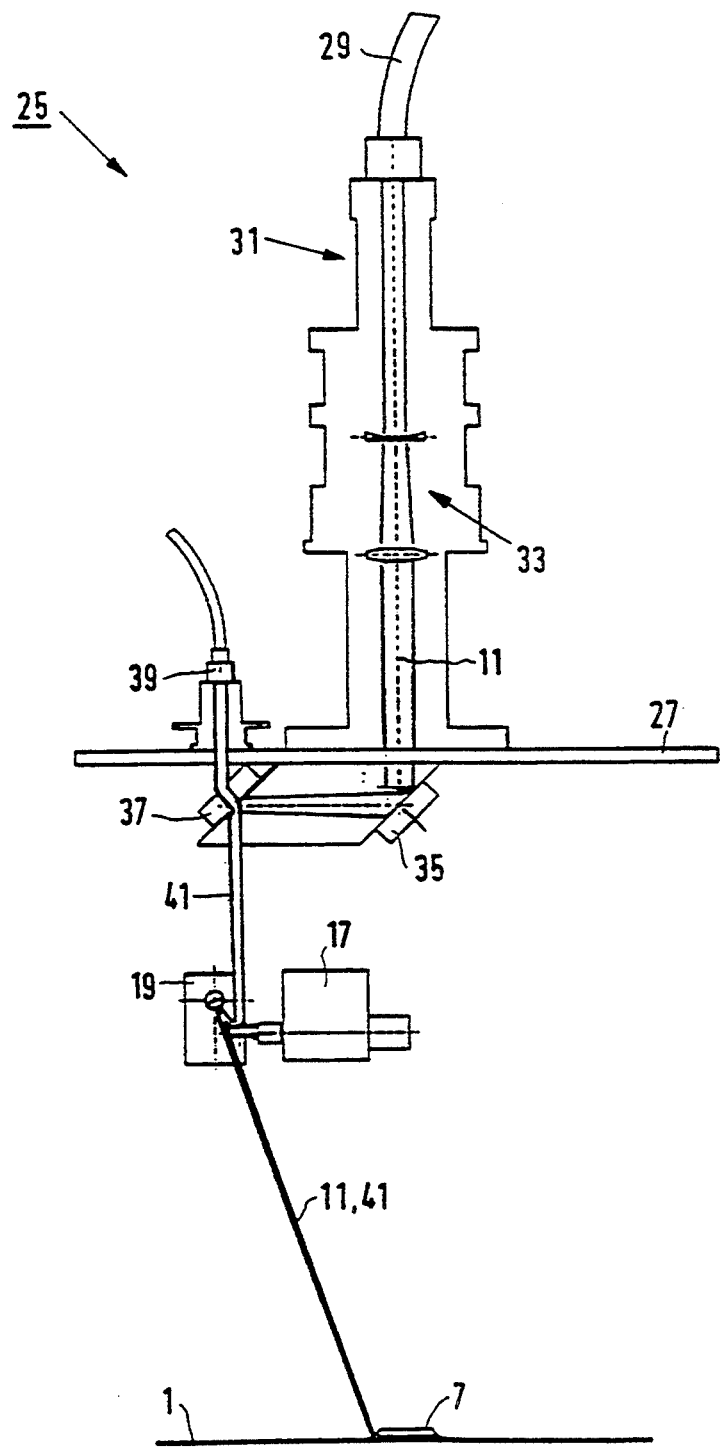

FIG. 5 shows another portion of the device depicted in FIG. 1, here showing a laser head 25 which is fastened to the placement head 13 by means of a plate 27. The device has two such laser heads 25. The laser head 25 is provided with a fiber 29 which is coupled at one side to an Nd-YAG laser system 205, 207 having a fixed position and is coupled at another side to a beam widener 31. The fiber 29 being flexible, the placement head 13 can be displaced relative to the laser system 205, 207. The beam widener 31 focuses the laser beam coming from the laser system by means of a lens system 33 which comprises a planoconcave and a double-convex lens which are movable relative to one another. The diameter of the laser beam 11 hitting the pc-board 1 can be varied between 0,8 and 2,0 mm thereby, in dependence on the intensity required for soldering. The laser beam coming from the beam widener 31 is deflected onto the mirror 21 of the galvanometer 17 by two mirrors 35, 37. An Nd-YAG laser system produces light which is invisible to the eye. To render alignment of the laser beam possible, a laser beam of visible light 41 derived from a diode laser 39 is added to the laser beam 11. The mirror 37 is provided with a layer by which light having a wavelength of the laser beam 11 is deflected by the mirror 37, while the visible light 41 is transmitted by the mirror 37. The laser beam 11 and the visible light 41 are then directed to the desired position on the pc-board 1 by the mirrors of the galvanometers 17 and 19.

Figure 6:
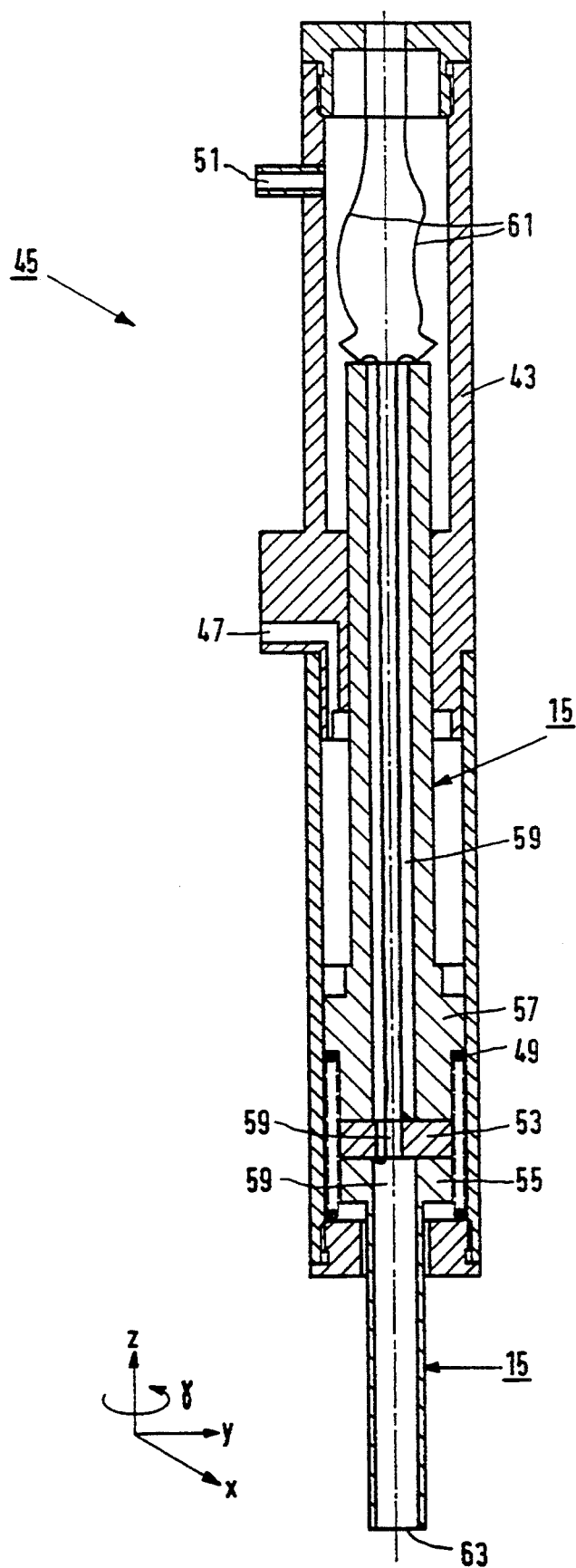
FIG. 6 shows a suction tube with a vibration transducer used in a first embodiment of the device according to the invention.
Figure 7:
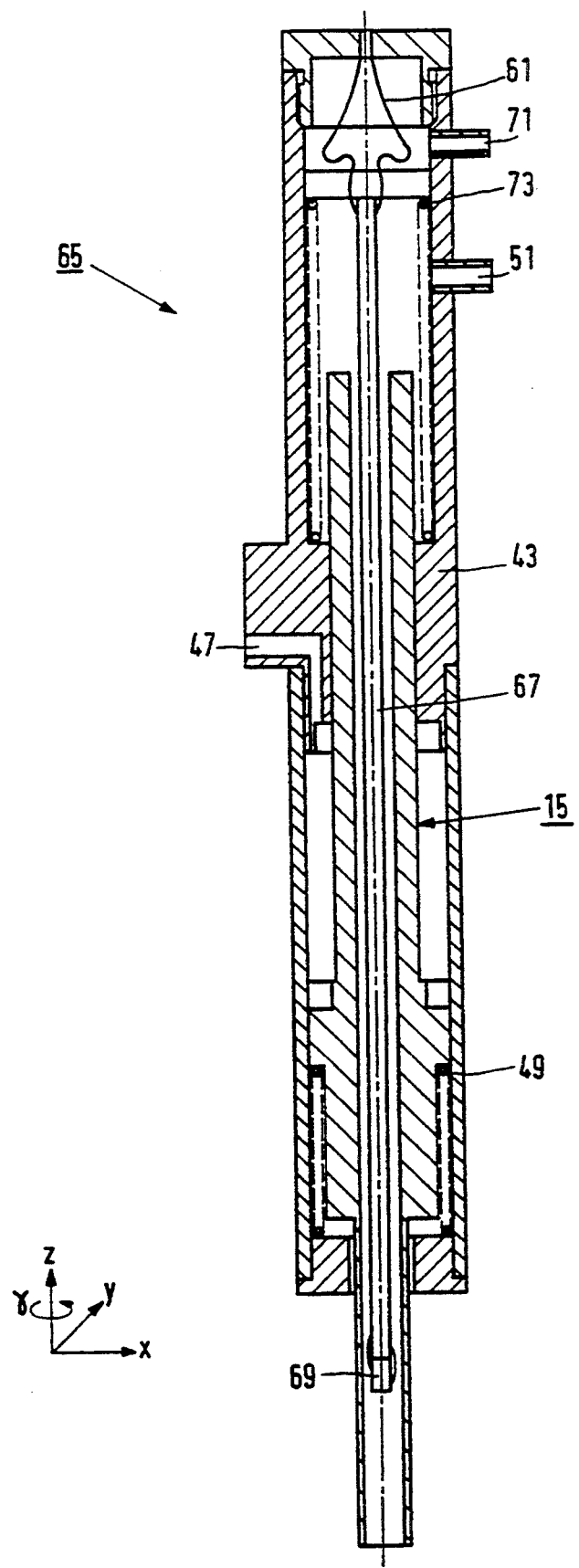
FIG. 7 shows a suction tube with a vibration transducer used in a second embodiment of the device according to the invention.
Figure 8:
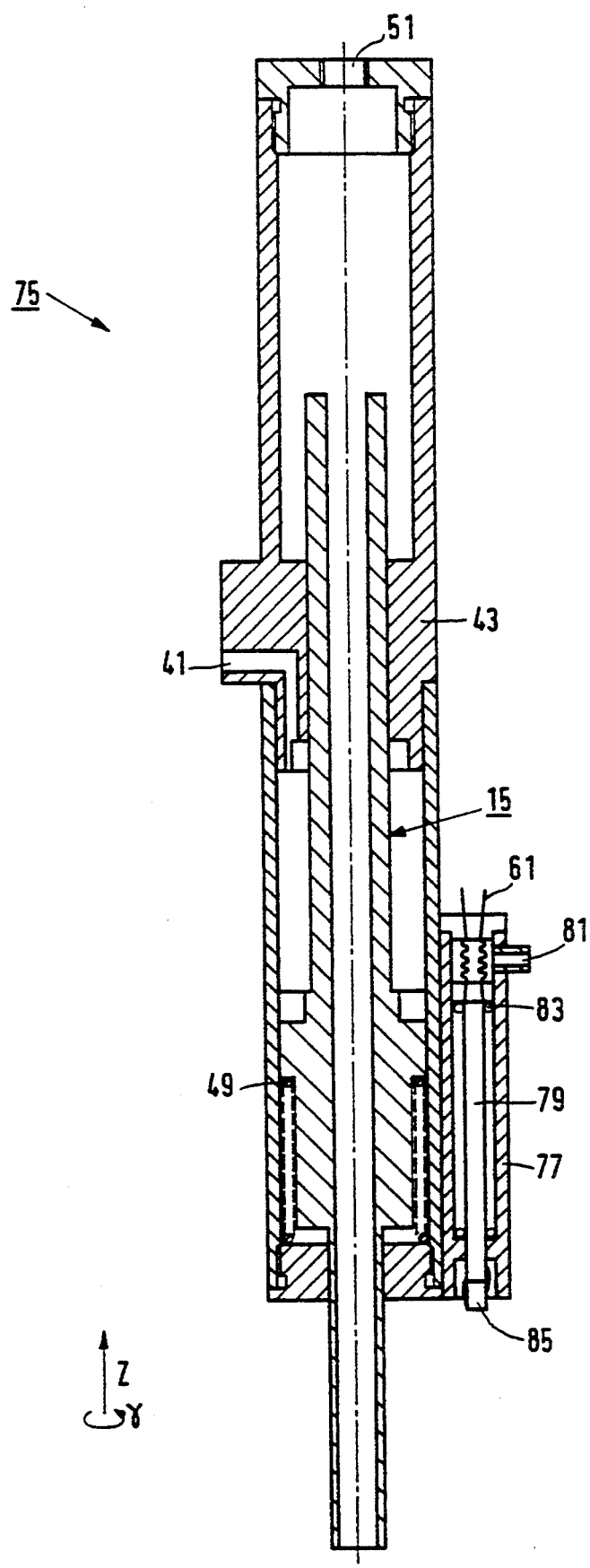
FIG. 8 shows a suction tube with a vibration transducer used in a third embodiment of the device according to the invention.

FIGS. 6 to 8 show parts of different embodiments of the device according to the invention, i.e. the placement head 13 with the suction tube 15.

The portion 45 of the device according to the invention shown in FIG. 6 comprises a suction tube 15 which is displaceable in a tubular holder 43. The holder 43 is provided with a compressed air connection 47 by means of which the suction tube 15 is displaceable against the spring pressure of a helical spring 49 in the negative z-direction The return movement of the suction tube 15 in the holder 43 is effected by the spring 49. An underpresure is generated in the suction tube 15 through a vacuum connection 51, so that the suction tube 15 can pick up components at an opening 63. The suction tube 15 is provided with an annular piezoelectric vibration transducer 53 which is situated between a first tube pan 55 and a second tube pan 57 of the suction tube 15. The tube pans 55, 57 are in mechanical hard contact with one another by means of the vibration transducer 53. A channel 59 in which an underpressure can be generated by the vacuum connection 51 is present in the tube pans 55, 57 and the vibration transducer 53. The portion of the channel 59 inside the annular piezoelectric vibration transducer 53 is preferably arranged eccentrically, whereby vibrations in the air flow in the channel 59 can be better detected than in the case of a central arrangement. The vibration transducer 53 is provided with connection wires 61 which are connected to a processing unit (not shown). The operation of the vibration transducer 53 will be described further below.

The portion 65 of the second embodiment of the device according to the invention shown in FIG. 7 is provided with a suction tube 15 displaceable in a tubular holder 43, as is the portion 45. The suction tube 15 is displaceable in the negative z-direction in the same way as described above. The suction tube comprises a round pin 67 which is displaceable in the z-direction and is provided with a vibration transducer 69. The pin 67 is displaceable in the negative z-direction against the force of a spring 73 by means of compressed air coming through connection 71, and is displaceable in the positive z-direction by means of the spring 73. After a component 7 has been placed on a pc-board 1 with the suction tube 15, the vibration transducer 69 is brought into contact with the component 7 so as to measure vibrations in the component 7. The suction tube 15 may be displaced in the z-direction before the measurement, or it remains against the component during the measurement.

Figure 15:
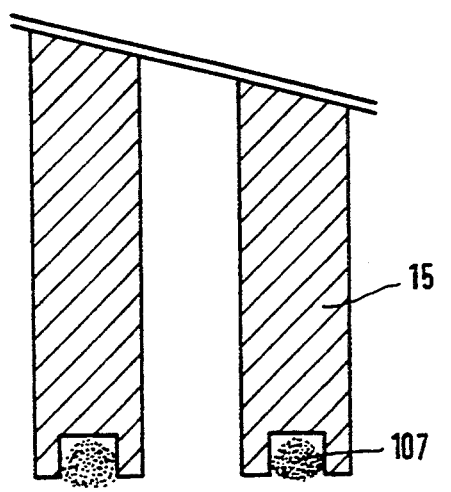
FIG. 15 shows an end of a suction tube according to the invention.

FIG. 15 shows an embodiment of a suction tube 15 which is provided with an O-ring 107 and is suitable for use in the assembly 65 described above. The O-ring 107 ensures a good vacuum seal between the component and the suction tube and ensures that the component will not rotate relative to the suction tube 15 during laser soldering.

FIG. 8 shows a portion 75 of the third embodiment of the device according to the invention which is provided, as is the portion 45, with a suction tube 15 displaceable in a holder 43. The suction tube 15 is displaceable in the negative z-direction against the force of the spring 49. A second tubular holder 77, in which a round pin 79 is displaceable against the force of a spring 83 by means of compressed air coming through connection 81, is fastened to the holder 43. The pin 79 is provided with a vibration transducer 85 which can be brought into hard contact with a component.

The vibration transducer may be a piezoelectric vibration transducer, an acceleration transducer, or a magnetostritive sensor.

The operation of the device as shown in FIG. 1 will now be explained briefly.

A component 7 is picked up by the suction tube 5 and then put in a correct position on the pc-board 1 in a manner known per se.

It is stored in a computer memory (not shown) what kind of component 7 has been placed where, and where the connection legs 9 of the component 7 are situated relative to the component. The galvanometers 17, 19 are then so controlled that, upon switching-on of the laser, a laser beam 11 hits the pc-board 1 or the connection legs 9 in the correct position via the beam widener 31 and the mirrors 35, 37, 23 and 21. The solder 5 is heated and melted, so that an electrical and mechanical connection between the component 7 and the pc-board 1 has been created after hardening of the solder. The laser beam 11 is moved by means of the galvanometers 17, 19, and a next connection can be made.

A number of checks can be carried out during laser soldering, each of them promoting a correct placement of the component 7 on the pc-board 1 and/or a good soldered joint.

1. Check as to whether the suction tube 15 has actually picked up a component 7 in the component pick-up phase.
2. Check as to the moment at which the component 7 touches the solder on the pc-board 1 during placement of the component on the pc-board.
3. Check as to whether there is mechanical contact between the connection leg 9 of the component 7 and the solder on the pc-board 1 the moment heating of the solder by the laser beam starts.
4. Check as to whether the solder 5 has melted, provided contact was present and solder is heated.

The assembly 45 shown in FIG. 6 renders it possible to carry out all four checks. The assemblies shown in FIGS. 7 and 8 render it possible to carry out the last two checks. The first two checks may then be carded out in a different manner, for example, by means of an optical sensor.

If the suction tube 15 has not taken up a component, a turbulent air flow arises in the suction tube 15 owing to the underpressure generated in the suction tube 15 via the vacuum connection 51. This air flow causes a whistling tone which can be detected by the vibration transducer 53.

When the descending component 7 hits the pc-board 1, the component 7, and thus also the suction tube 15, experiences a comparatively great deceleration. This deceleration can be measured by the vibration transducer 53 and the air supply through the compressed air connection 47 can be stopped when the deceleration has reached a certain value. It is possible to use the force limiter described in European Patent Application EP-A1 0335449 to prevent the compression force exerted on the component by the suction tube rising further when the air supply is stopped, so that the component cannot be damaged.

Figure 9:
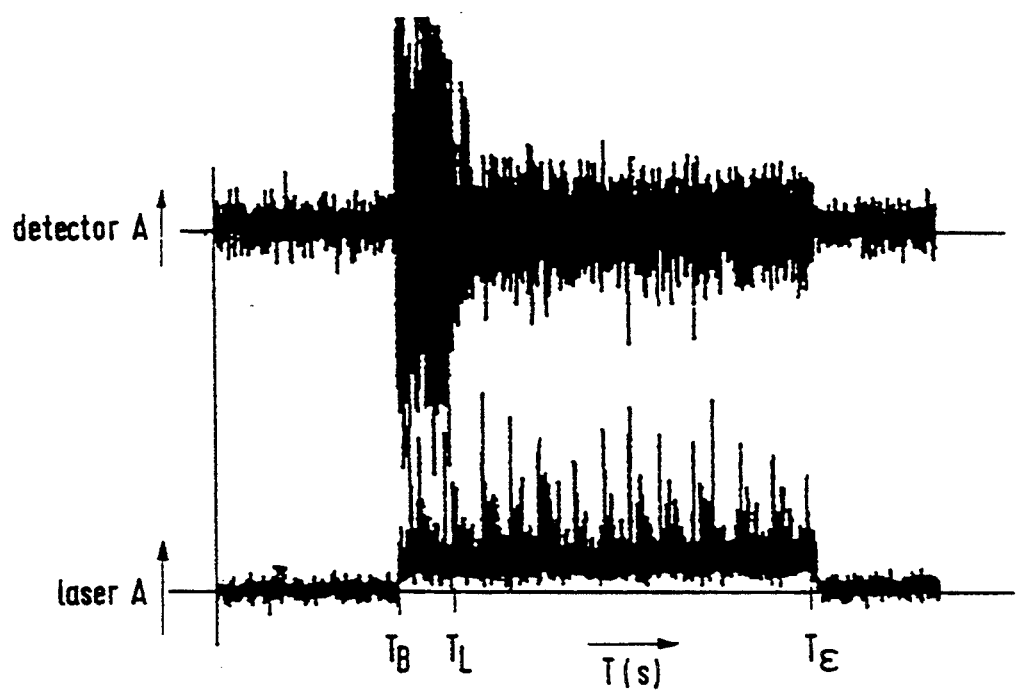
FIGS. 9, 10 and 11 show graphs in which signals measured by means of the vibration transducer are depicted.
Figure 10:
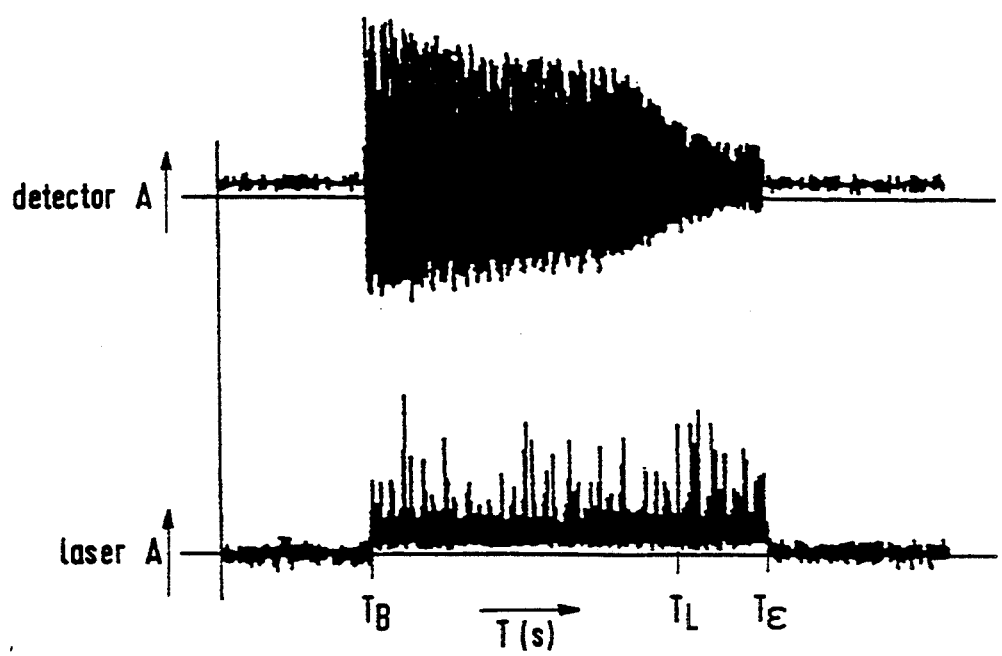
Figure 11:
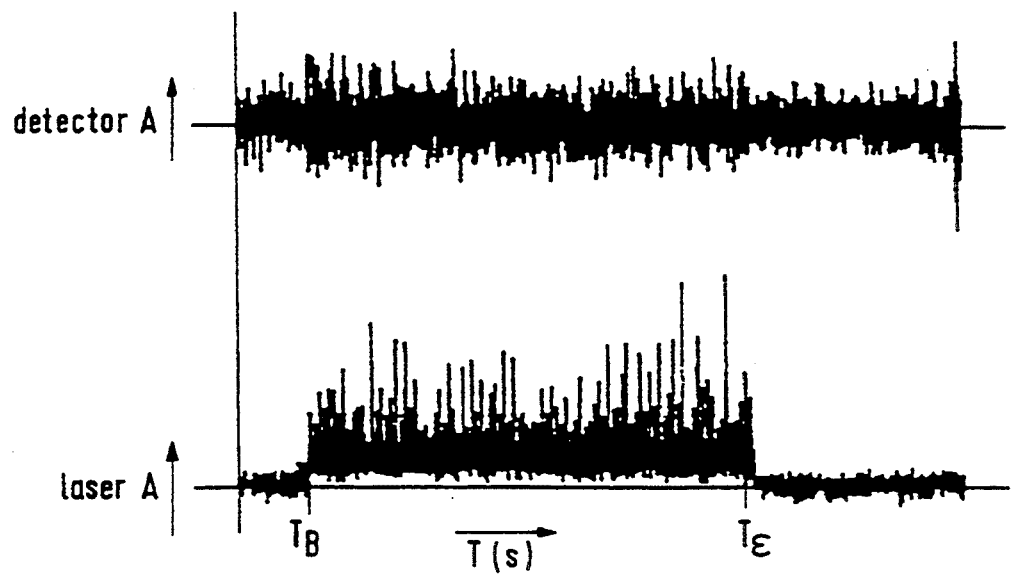

FIGS. 9, 10 and 11 show double graphs in which the voltage supplied to the laser system is plotted in the lower pan and the signal measured by the vibration transducer is plotted in the upper pan, while the time in seconds is plotted along the joint horizontal axis. FIG. 9 shows a measurement at a connection leg lying against the solder on the contact face. The laser system is switched on at the moment $T_B$ and a signal is measured by the vibration transducer. The amplitude of the measured signal drops at the moment $T_L$. The moment $T_L$ corresponds to the moment at which the solder has melted. The solder is heated further up to the moment $T_E$, after which the laser system is switched off.

FIG. 10 shows a similar double graph of a measurement at a connection leg having a higher heat capacity than the connection leg measured in FIG. 9. Here also a signal having a comparatively great amplitude is measured by the vibration transducer upon switching-on of the laser system at moment $T_B$. The moment $T_L$ corresponds to the time at which the solder has melted.

FIG. 11 shows a further similar double graph of a measurement at a similar connection leg to the one measured according to FIG. 9. Starting from the moment $T_B$ at which the laser system was switched on, the vibration transducer does not detect a different signal from the one obtaining before switching on of the laser system. It was found in practice that this means that the connection leg does not make contact with the solder. After the detection of a contact failure between the connection leg and the solder, the laser system must be switched off as quickly as possible to prevent damage to the pc-board or the connection leg. It is possible to proceed as follows in practice: if after switching on of the laser system the vibration transducer does not detect a signal having a higher amplitude than before switching on of the laser system within a preset time, this laser system must be switched off immediately because there will be a contact failure then between the connection leg and the solder. During laser soldering, the vibration transducer can determine both the presence of contact between the connection leg and the solder and the moment at which the solder has melted. A reliable and efficient soldering process is obtained in this way.

Figure 12:
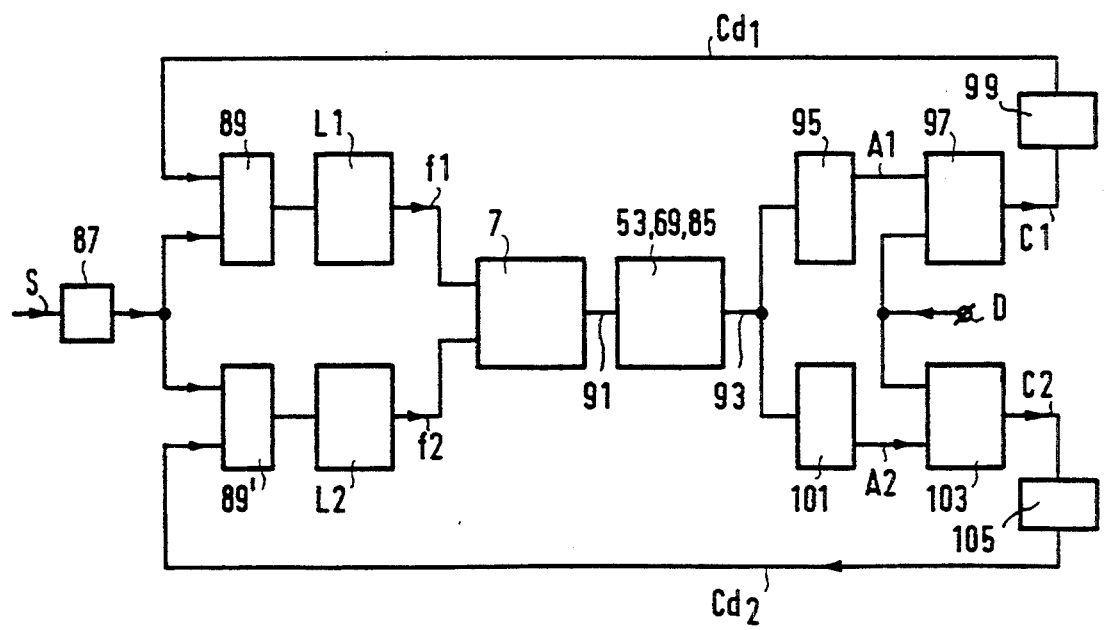
FIG. 12 is a block diagram of a control circuit for the device according to the invention, FIG. 13 diagrammatically shows time diagrams of soldering of a leg making contact and a loose leg.
Figures 13A, 13B:
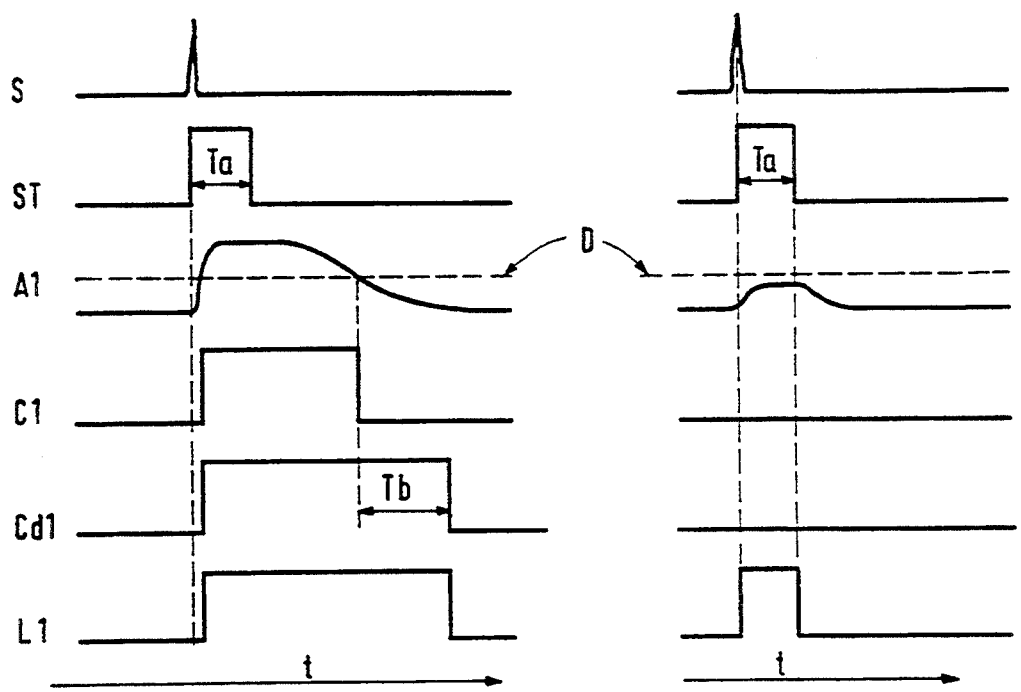
Figure 14:
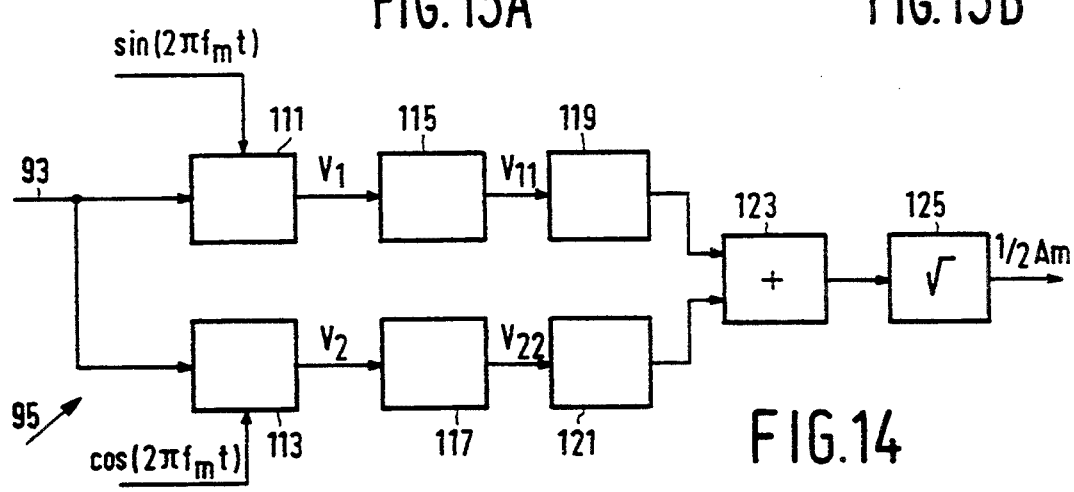
FIG. 14 shows a block diagram of a filter for processing the signals measured by the vibration transducer according to the invention.

FIG. 12 is a block diagram of an arrangement for controlling two laser systems L1, L2, each having one laser beam. Two connection legs are soldered simultaneously by the laser beams. FIG. 13 shows time diagrams of various signals corresponding to FIG. 12, in the case of a leg making contact and of a loose leg. Each laser system is provided with a so-called Q-switch. This is an electro-optical switch which opens and closes at a given frequency, a laser beam of high power being obtained when the Q-switch is opened. The Q-switch of laser system L1 is controlled with a frequency $f_1$, while the Q-switch of laser system L2 is controlled with frequency $f_2$.

The control of laser system L1 only of the control diagram is described. The laser system L2 is controlled in an identical manner. S is the start signal for the laser soldering process, provided by a computer (not shown) after a component has been placed on the pc-board. This signal S is provided to circuit 87, which generates a pulse ST with a duration Ta. The laser system L1 is switched on thereby for a minimum duration Ta via a logic OR circuit 89. In a normal situation, in which the leg of the component 7 lies against the pc-board, the time Ta is so long that a sufficiently strong acoustic signal 91 is generated, whereby the electric signal 93 generated in the vibration transducer 53, 69, 85 rises above a threshold level D which is to be set. A signal A1 with a frequency $f_1$ is filtered from the electric signal 93 by means of a filter 95. The signal A1 is compared with the threshold level D in a comparator 97, and the moment the signal A1 is greater than D the comparator 97 provides a signal C 1 by which the laser system L1 is kept switched-on by means of the OR circuit 89. During melting, the electric signal A 1 drops to below the threshold level D again. From this moment onwards, the delay circuit 99 still keeps the laser system L1 switched-on by means of the signal Cdl during a period Tb, which can be set, so that the solder is heated further. The laser system L1 is switched off after the period Tb has elapsed.

If a connection leg of a component 7 fails to make contact with the pc-board 1, the signal A1 does not rise above the threshold level D during the time interval Ta. The signal provided by the comparator 97 does not change, and the laser system L1 is switched off immediately after Ta to prevent burning of the connection leg or the pc-board.

The laser system L2 is controlled in an analogous manner compared with the laser system L1, via a filter 101, a comparator 103, and a delay circuit 105.

FIG. 13 shows a method by which the amplitude of signal A1 or A2 can be determined from the signal 93 in filter 95 or 101. The portion of the signal 93 corresponding to frequency $f_1$ can be written as:

$$V_m = A_{m1} \sin(2\pi f_1 t + \phi) + \text{interference signals} + \text{higher harmonics}$$

$\phi$ here is the phase of the signal. The phase depends inter alia on the distance between the vibration transducer and the solder, and on the propagation velocity of the ultrasonic wave in the various materials between the location irradiated by the laser beam and the vibration transducer. $A_{m1}$ is the amplitude of the signal A1 to be determined. The object is to determine the amplitude $A_{m1}$ independently of the phase $\phi$ of the signal, and thus independently of the propagation velocity and the distance between the solder and the vibration transducer. This is achieved in that the measured signal 93 is processed in the following way. First, the signal $V_m$ is multiplied by a signal having the frequency $f_1$ in two frequency multipliers 111 and 113, as follows:

$$V_1 = \sin(2\pi f_1 t) \cdot \{A_{m1} \sin(2\pi f_1 t + \phi) + \text{interference signals} + \text{higher harmonics}\}$$

$$V_2 = \cos(2\pi f_1 t) \cdot \{A_{m1} \sin(2\pi f_1 t + \phi) + \text{interference signals} + \text{higher harmonics}\}$$

Both $V_1$ and $V_2$ comprise a component dependent on the phase $\phi$ and a component having the double frequency $2f_1$, as well as interference signals and higher harmonics. The component of the signal $V_1$ amd $V_2$ depending on the phase $\phi$ is determined by means of low-pass filters 115, 117:

$$V_{11} = \tfrac{1}{2} A_m \cdot \cos(\phi)$$

$$V_{22} = \tfrac{1}{2} A_m \cdot \sin(\phi)$$

The value $\tfrac{1}{2} A_m$ can be determined from $V_{11}$ and $V_{22}$ by carrying out in that order: squaring by means of the elements 119 and 121, adding by means of the summation circuit 123, and root extraction by means of the circuit 125. The amplitude $A_m$ is obtained by multiplication of $\tfrac{1}{2} A_m$ by 2. The amplitude is thus determined independently of the phase $\phi$ of the signal $V_m$, so that the amplitude may be ascertained at any moment.

The solder may be heated directly or indirectly during laser soldering. By direct heating is meant that the laser beam is directed against the solder, so that the solder melts, while indirect heating means that the laser beam is directed against a connection leg making contact with the solder, so that the solder melts owing to heating of the connection leg.

The suction tube may be made of a synthetic resin or metal, depending on the desired vibration sensitivity. The suction tube may be arranged in the holder with rotation possibility in order to put a component on the pc-board in the desired position, while the laser heads are rotatable in order to render it easier for the holder to align the laser beams.

The components may be checked for coplanarity of the legs before placement, if so desired, so that the risk of a loose leg during soldering is reduced. It remains desirable, however, to check whether the connection leg lies against the contact face during during soldering.

The components may also be so-called SMD components. These are components provided with connection faces instead of connection legs, which connection faces may be provided with solder.

We claim:

1. A method of positioning an object on a carrier wherein an object is picked up by a suction tube by means of underpressure and is subsequently placed on a contact face of a carrier by a device comprising the suction tube and a vibration transducer, comprising the steps of bringing said vibration transducer into mechanical hard contact with the object while the object is being held against the carrier, heating solder present on the contact face by means of a laser and passing on to the vibration transducer vibrations generated by the laser in the solder while the mechanical hard contact is maintained, and by means of said transducer, performing at least one of the additional steps of checking the presence of mechanical contact between the object and the carrier, detecting the melting of the solder from a comparatively strong decrease in the vibration amplitude during melting of the solder, and registering the presence of mechanical contact and the melting of the solder.

2. A method of positioning a component on a pc-board wherein a component is picked up by a suction tube by means of underpressure and is subsequently placed on a contact face of the pc-board by a device comprising the suction tube and a vibration transducer, comprising the steps of bringing said vibration transducer into mechanical hard contact with the component while the component is being held against the pc-board, heating solder present on the contact face by means of a laser and passing on to the vibration transducer vibrations generated by the laser in the solder while the mechanical hard contact is maintained, and by means of said transducer, performing at least one of the additional steps of checking the presence of mechanical contact between the component and the pc-board, detecting the melting of the solder from a comparatively strong decrease in the vibration amplitude during melting of the solder, and registering the presence of mechanical contact and the melting of the solder.

3. A method of positioning an object on a carrier wherein an object is picked up by a suction tube by means of underpressure and is subsequently placed on a contact face of a carrier by a device comprising the suction tube and a vibration transducer, comprising the steps of bringing said vibration transducer into mechanical hard contact with the object during picking-up of the object, and during placement of the object on the carrier the descent of the obiect onto the carrier being detected by the vibration transducer, heating solder present on the contact face by means of a laser and passinq on to the vibration transducer vibrations qenerated by the laser in the solder while the mechanical hard contact is maintained.

4. A method as claimed in claim 3 wherein said transducer performs at least one of the additional steps of detecting the melting of the solder from a comparatively strong decrease in the vibration amplitude during melting of the solder, and registering the presence of mechanical contact and the melting of the solder.

5. A method of positioning a component on a pc-board wherein a component with a connection part is picked up by a suction tube by means of underpressure and is subsequently placed on a contact face of a pc-board by a device comprising the suction tube and a vibration transducer, comprising the steps of bringing said vibration transducer into mechanical hard contact with the component during picking-up of the component, and during placement of the component on the pc-board the descent of the component onto the pc-board being detected by the vibration transducer, heating solder present on the contact face by means of a laser via the connection part of said component and passing on to the vibration transducer vibrations generated by the laser in the solder while the mechanical hard contact is maintained.

6. A method as claimed in claim 5 wherein said transducer performs at least one of the additional steps of detecting the melting of the solder from a comparatively strong decrease in the vibration amplitude during melting of the solder, and registering the presence of mechanical contact and the melting of the solder.

* * * * *